(12) United States Patent
Stark

(10) Patent No.: US 8,026,772 B2
(45) Date of Patent: Sep. 27, 2011

(54) MICROWAVE GENERATOR HAVING AT LEAST TWO SPARK GAPS CONNECTED IN SERIES

(75) Inventor: Robert Stark, Bad Windsheim (DE)

(73) Assignee: Diehl BGT Defence GmbH & Co. KG, Ueberlingen (DE)

( * ) Notice: Subject to any disclaimer, the term of this patent is extended or adjusted under 35 U.S.C. 154(b) by 443 days.

(21) Appl. No.: 12/234,897

(22) Filed: Sep. 22, 2008

(65) Prior Publication Data

US 2009/0079347 A1  Mar. 26, 2009

(30) Foreign Application Priority Data

Sep. 20, 2007  (DE) .................. 10 2007 044 821

(51) Int. Cl.
*H01P 1/04* (2006.01)
(52) U.S. Cl. .......................................... 333/13; 361/130
(58) Field of Classification Search .................. 315/39; 333/13, 219, 222; 361/130
See application file for complete search history.

(56) References Cited

U.S. PATENT DOCUMENTS

| | | | |
|---|---|---|---|
| 3,484,619 A | 12/1969 | Proud, Jr. | |
| 3,748,528 A * | 7/1973 | Cronson .................. | 315/39 |
| 6,822,394 B2 * | 11/2004 | Staines et al. ................ | 315/39 |
| 7,002,300 B2 * | 2/2006 | Urban et al. ............. | 315/39.51 |
| 7,215,083 B2 * | 5/2007 | Staines ........................ | 315/39 |
| 7,439,677 B2 * | 10/2008 | Dommer et al. ................ | 315/39 |
| 7,626,468 B2 * | 12/2009 | Staines ........................ | 331/96 |
| 7,741,783 B2 * | 6/2010 | Stark et al. ................ | 315/39.51 |
| 7,842,907 B2 * | 11/2010 | Stark et al. .................... | 219/761 |
| 2007/0019414 A1 | 1/2007 | Staines | |
| 2007/0068934 A1 | 3/2007 | Dommer et al. | |
| 2008/0036549 A1 | 2/2008 | Stark et al. | |

FOREIGN PATENT DOCUMENTS

| | | |
|---|---|---|
| DE | 647 925 | 7/1937 |
| DE | 1 222 126 | 8/1966 |
| DE | 1 591 225 | 9/1971 |
| DE | 10 2005 002 279 A1 | 7/2006 |
| DE | 10 2005 013 925 A1 | 9/2006 |
| DE | 10 2005 034 295 B4 | 1/2007 |
| DE | 10 2005 044 353 A1 | 4/2007 |
| EP | 1473866 A1 | 11/2004 |
| GB | 962 306 | 10/1962 |
| GB | 1 132 183 | 10/1967 |

* cited by examiner

*Primary Examiner* — Thuy Vinh Tran
(74) *Attorney, Agent, or Firm* — Laurence A. Greenberg; Werner H. Stemer; Ralph E. Locher

(57) ABSTRACT

A microwave generator includes a resonator which has two mutually opposite resonator electrodes formed with a spark gap device that breaks down when an ignition voltage is applied. In order to provide the microwave generator with increased power, in which the resonator can be operated at relatively high ignition voltages or field strengths, the spark gap device has at least two spark gaps connected in series.

18 Claims, 4 Drawing Sheets

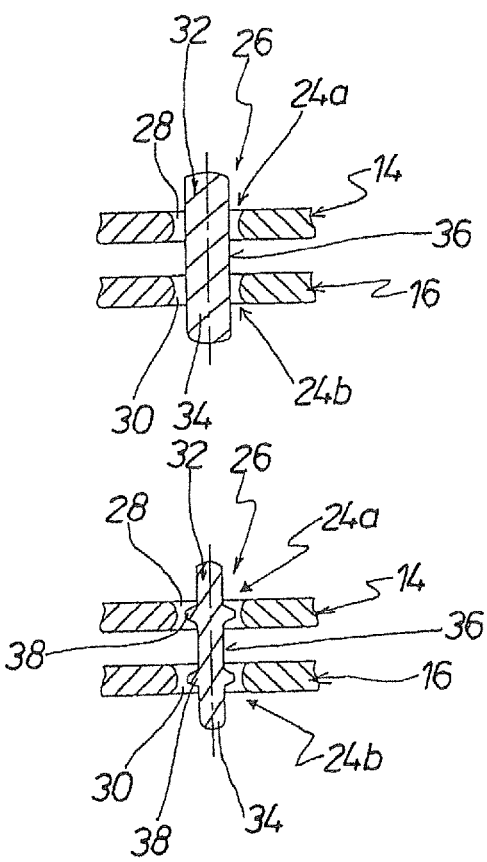
FIG. 6A
FIG. 6B
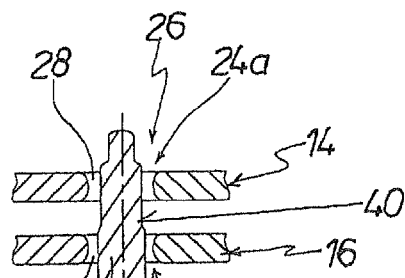
FIG. 6C
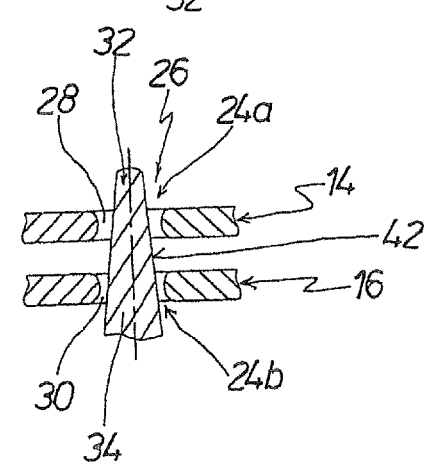
FIG. 6D

MICROWAVE GENERATOR HAVING AT LEAST TWO SPARK GAPS CONNECTED IN SERIES

CROSS-REFERENCE TO RELATED APPLICATION

This application claims the priority, under 35 U.S.C. §119, of German Patent Application DE 10 2007 044 821.1, filed Sep. 20, 2007; the prior application is herewith incorporated by reference in its entirety.

BACKGROUND OF THE INVENTION

Field of the Invention

The invention relates to a microwave generator with a resonator having two mutually opposite resonator electrodes, which are formed with a spark gap device that breaks down when an ignition voltage is applied.

German Published, Non-Prosecuted Patent Application DE 10 2005 002 279 A1, corresponding to U.S. Pat. No. 7,215,083 B2, has disclosed a microwave generator with two electrodes which are provided in a housing and are separated through a spark gap, that breaks down on the application of a high voltage for emitting microwaves. The one, outer electrode is in the form of a pot and engages over the other, inner electrode at least over part of its length spaced apart on the outside. The pot-like, outer electrode has a base section, which at the same time forms the lateral termination of the housing. The inner electrode is rounded in the form of a cap or hemisphere, and the outer electrode has a small spherical cap-shaped projection, with the two electrodes being positioned opposite one another on the projection at a small distance of a few millimeters, for example.

The regions of the electrode faces which have the smallest distance from one another corrode to a particularly severe extent. Given such a formation, the discharge is restricted to a very narrowly limited range of the minimum distance of the electrode surfaces, with the result that the electrode erosion is very pronounced and the life of the microwave generator is limited.

Those same problems exist with a microwave generator known from German Patent DE 10 2005 034 295 B4, corresponding to U.S. Patent Application Publication No. US 2007/0019414 A1.

In order to reduce the rate of erosion on the electrodes in the case of such microwave generators with a single spark gap and to make stable and reliable operation possible, German Published, Non-Prosecuted Patent Application DE 10 2005 013 925 A1, corresponding to U.S. Patent Application Publication No. US 2008/0036549 A1, proposes forming the electrodes in the region of the spark gap in such a way that, instead of a quasi punctiform construction, a two-dimensional or three-dimensional section with a substantially constant, minimum electrode spacing results. However, that known microwave generator also only has a single spark gap.

A microwave generator of the type mentioned at the outset, with a single spark gap in the form of an annular spark gap, is known from German Published, Non-Prosecuted Patent Application DE 10 2005 044 353 A1, corresponding to U.S. Patent Application Publication No. US 2007/0068934 A1.

All of those known microwave generators include a coaxial capacitance, which is discharged through a single spark gap, i.e. a spark gap device with a single spark gap. That capacitance forms, with the physical properties of the switch plasma in the spark gap and in connection with the electrical wiring, a resonant circuit, which includes a nonreactive resistance R, an inductance L and a capacitance C. The capacitance is charged through a charging impedance R, L to voltages of up to the 100 kV-MV range. The increasing charging voltage ultimately results in the breakdown of the spark gap, following Paschen's law. The breakdown of the spark gap can also be brought about in a targeted manner by a suitable trigger mechanism.

The physical properties of the spark gap, such as the breakdown voltage, the ambient pressure, the distance between the spark gap electrodes, the plasma impedance, etc. critically determine the switching response, i.e. the ignition response, of the spark gap discharge and therefore the rise time and the pulse shape or the different frequency components of the generated high-voltage pulse.

After the breakdown of the spark gap, the energy stored in the resonator resonant circuit is emitted entirely or partially through an emitting device, which is coupled to the resonator, i.e. an antenna, into the surrounding environment of the microwave generator.

The decoupling of the resonant circuit from the high-voltage generator which is, for example, a Marx generator, takes place through the use of impedances introduced into the charging circuit in the form of nonreactive or inductive resistors. The amount of energy emitted into the surrounding environment is determined critically by the impedance matching of the resonant circuit to the surrounding environment, i.e. the surrounding area. That impedance is 377Ω.

Given ideal matching, the entire energy would be emitted in the form of a square-wave pulse. Given slightly faulty matching, some of the energy or pulse is reflected on a sudden charge in the impedance and therefore results in a change in the pulse shape emitted in connection with the superimposition of the outgoing and returning wave. By corresponding matching of the impedance ratio, pulse shaping of the emitted pulse can therefore be achieved which equates to a damped sinusoidal oscillation.

Given extremely faulty matching, the system responds as a resonant circuit with a high magnification factor, with the result that virtually no energy is emitted into the surrounding environment. The energy remains in the system and results in a resonant oscillating response, until the energy is consumed by the inherent losses of the resonant circuit.

The number of oscillations, i.e. the magnification factor of the resonant circuit per pulse, can be altered by matching the sudden impedance change. In the case of a microwave generator, what is desired is a high voltage pulse generated, i.e. an electromagnetic pulse, which runs through at least one oscillation cycle up to a few tens of oscillation cycles.

The ignition response of the spark gap device of the microwave generator is determined by the ignition voltage characteristic. The ignition voltage characteristic (Paschen curve) describes the relationship between the product of the discharge gas pressure p, the associated electrode gap distance d and the ignition voltage Uz of the spark gap of the microwave generator. The ignition voltage Uz in this case describes the maximum holding voltage which can be applied to the spark gap before it finally forms a gas discharge, i.e. spark discharge, and therefore breakdown of the voltage applied through the spark gap takes place. The time profile of the breakdown of the voltage at the spark gap is primarily determined by the impedance (RL) of the gas or plasma discharge forming, the intrinsic capacitance of the spark gap and its external circuitry. FIG. 3 of the attached drawings represents the qualitative profile of an ignition voltage characteristic, i.e. the Paschen curve Uz=f(p.d). In general, the Paschen curve is defined for the ideal case of planar-parallel, infinitely extended electrodes, i.e. a homogeneous electrical field with ideal surfaces, and for a voltage which is applied in quasi steady-state fashion. In reality, those ideal conditions generally cannot be realized, however, since normally the electrode sections have narrowly restricted dimensions and the electrode gap distance is of approximately the same order of magnitude as the electrode diameter. In addition, the electrodes are generally unclean with contamination and have irregularities on the electrode surface as a result of machining or corresponding manufacturing processes. Both of those factors result in a distortion of the electrical field at the electrode surface and therefore in a change in the electron work function. Those effects influence the discharge buildup or the breakdown response of the spark gap. Despite that wide variety of different effects, which influence the breakdown response of the spark gap and therefore its breakdown characteristic, the profile of a real Paschen curve shows a qualitative profile which is similar to that for an ideal Paschen curve.

SUMMARY OF THE INVENTION

It is accordingly an object of the invention to provide a microwave generator, which overcomes the hereinafore-mentioned disadvantages of the heretofore-known devices of this general type, which has increased power with a simple structure and which can be operated at relatively high ignition voltages or field strengths.

With the foregoing and other objects in view there is provided, in accordance with the invention, a microwave generator, comprising a resonator having two mutually opposite resonator electrodes. The resonator electrodes are formed or constructed with a spark gap device breaking down upon application of an ignition voltage. The spark gap device has at least two spark gaps connected in series.

Other features, preferred embodiments and developments of the microwave generator which are considered as characteristic for the invention are set forth in the appended claims.

Additional features, details and advantages of the invention result from the description below and relate to embodiments illustrated in the drawing of the microwave generator according to the invention or important individual features thereof in comparison with a known microwave generator.

Although the invention is illustrated and described herein as embodied in a microwave generator, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE SEVERAL VIEWS OF THE DRAWING

FIGS. 6A to 6D are fragmentary, longitudinal-sectional views of various electrode configurations similar to that in FIG. 5;

DETAILED DESCRIPTION OF THE INVENTION

Figure 1:
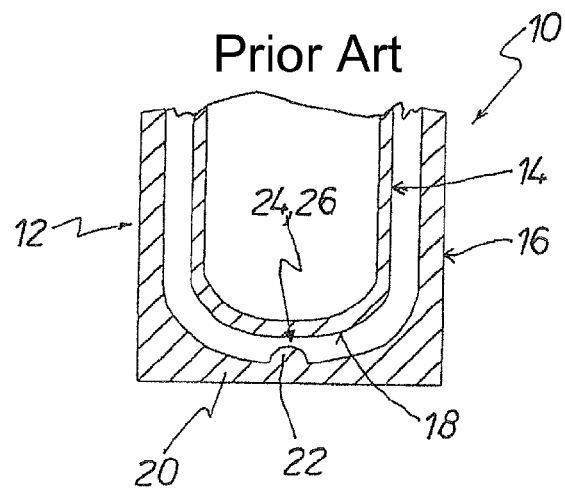
FIG. 1 is a fragmentary, diagrammatic, longitudinal-sectional view of a known embodiment of a microwave generator.

Referring now to the figures of the drawings in detail and first, particularly, to FIG. 1 thereof, there is seen a fragmentary, longitudinal-sectional view of important parts of a known microwave generator 10 with a resonator 12, which has an inner electrode 14 and an outer electrode 16, that are opposite one another and spaced apart in a defined manner from one another. The inner electrode 14 is lobe-like and the outer electrode 16 is pot-like. The pot-like outer electrode 16 engages over the lobe-like inner electrode 14. The inner electrode 14 and the outer electrode 16 are constructed so as to be rotationally symmetrical and are disposed coaxially with respect to one another. The inner electrode 14 is formed with a convexly spherical end face 18. The pot-like outer electrode 16 has a base 20, which is formed on the inside with a central elevation 22. A spark gap 24 is formed between the elevation 22 of the base 20 of the outer electrode 16 and the end face 18 of the inner electrode 14. This one spark gap 24 forms a spark gap device 26 of the resonator 12 of the known microwave generator 10.

Figure 2:
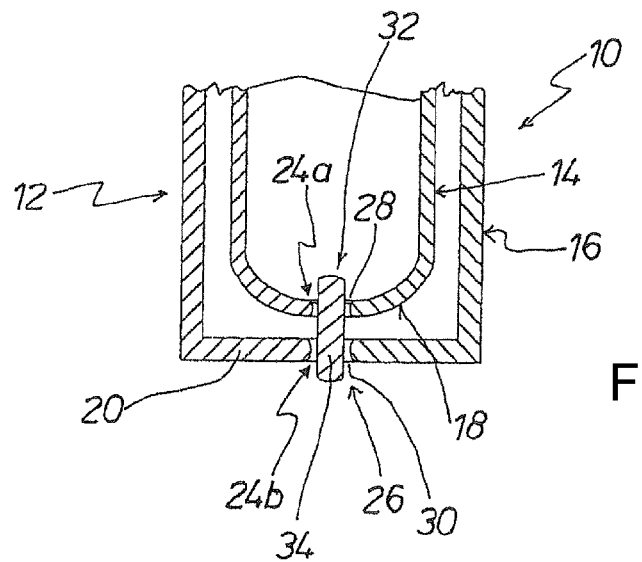
FIG. 2 is a fragmentary, longitudinal-sectional view similar to that in FIG. 1, of an embodiment of a microwave generator according to the invention.

FIG. 2 illustrates an embodiment of the microwave generator 10 according to the invention, in which the spark gap device 26 has two spark gaps 24a and 24b connected in series. For this purpose, the lobe-like or lobe-shaped inner electrode 14 of the resonator 12 is formed with a central first hole 28, and the base 20 of the pot-shaped outer electrode 16 is formed with a central second hole 30. A conductor device 32 extends through the first and second holes 28 and 30 and is spaced apart from the hole rims of the electrodes. In the embodiment shown in FIG. 2, the conductor device 32 is formed by an integral or one-piece conductor element 34.

The series configuration of the spark gaps 24a and 24b can be considered to be a series connection of capacitances during a charging phase of the resonator 12. When a plurality of capacitances are connected in series, the total voltage applied is distributed over the number of capacitances. The total voltage results from the sum of the individual voltages applied.

The basic principle of the series connection of at least two spark gaps can be realized in different geometric configurations.

In practice, this means that when, for example, two spark gaps 24a and 24b are connected in series, the voltage loading at the individual series spark gaps 24a, 24b is halved in comparison with a single spark gap 24 (see FIG. 1) given the same total voltage Uz,0 at the resonator 12 if the spark gaps 24a, 24b are equal in size. If the two series spark gaps 24a and 24b each again have the voltage Uz,0 (see FIG. 3) applied to them with correspondingly high p.d values, in the ideal case, i.e. in the case of identical spark gap configurations of the individual spark gaps 24a and 24b, with loss processes and secondary capacitances, etc. being neglected, the maximum possible total voltage for operating the resonator 12 can be virtually doubled, which also is substantially dependent on the actual profile of the individual ignition voltage characteristic of the spark gaps 24a and 24b in the different configurations. The power of the resonator 12 or the emitted field strength can thus be considerably increased.

Figure 3:
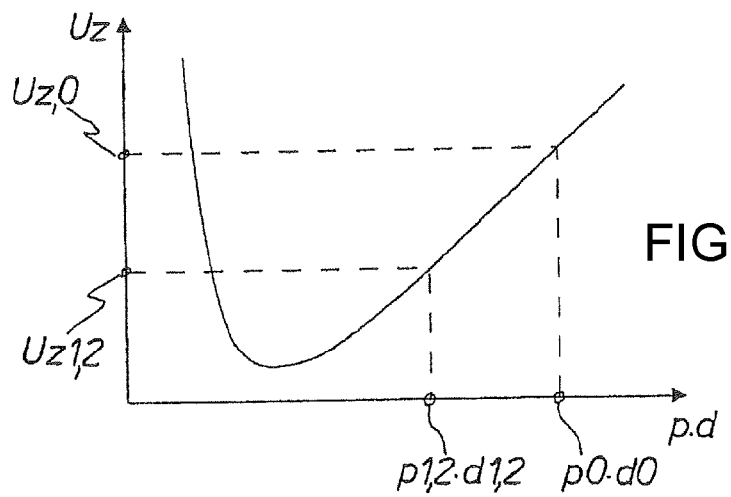
FIG. 3 is a graphical illustration of an ignition voltage characteristic, i.e. a Paschen curve, of a spark gap device of a known microwave generator wherein the spark gap device is formed by a single spark gap as shown in FIG. 1, and a microwave generator according to the invention with a spark gap device which has two spark gaps connected in series, as shown in FIG. 2; 0

FIG. 3 shows, in a graphical illustration, the ignition voltages Uz,1,2 and the associated p.d values p1,2.d1,2 when using a series configuration of two spark gaps 24a and 24b, as well as the ignition voltage Uz,0 and the associated p.d value p0.d0 of a single spark gap 24 (see FIG. 1) with identical voltage loading Uz,0 of the resonator 12. In the ideal case, when two spark gaps 24a and 24b are connected in series, the total voltage is distributed uniformly among the two series spark gaps. During operation of the resonator 12, this would correspond to a markedly lower p.d value p1,2.d1,2 of the individual series spark gaps 24a, 24b. If the series spark gap configuration is now operated at higher p.d values, i.e. at p.d>p1,2×d1,2, the operating voltage of the resonator 12 can be markedly increased.

Figure 4:
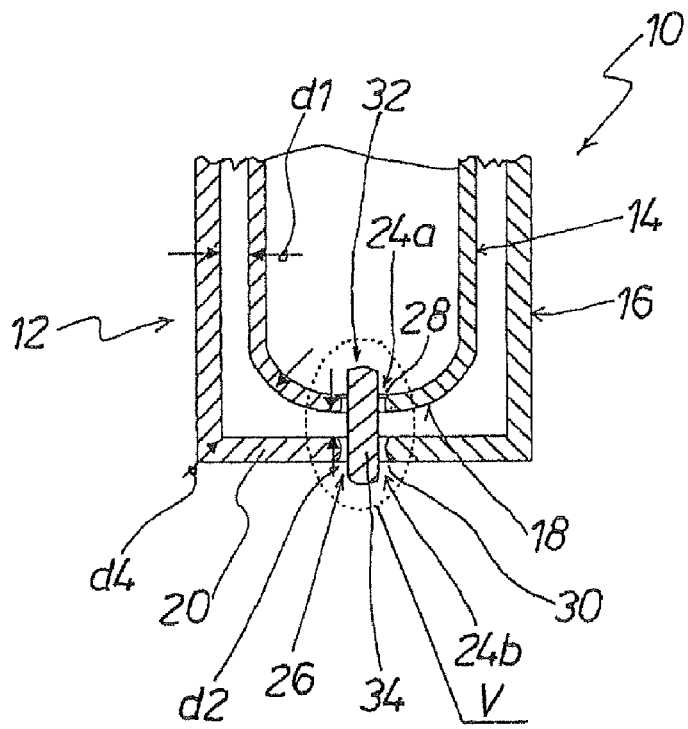
FIG. 4 is a fragmentary, longitudinal-sectional view corresponding to that in FIG. 2, for illustrating the spark gaps connected in series.
Figure 5:
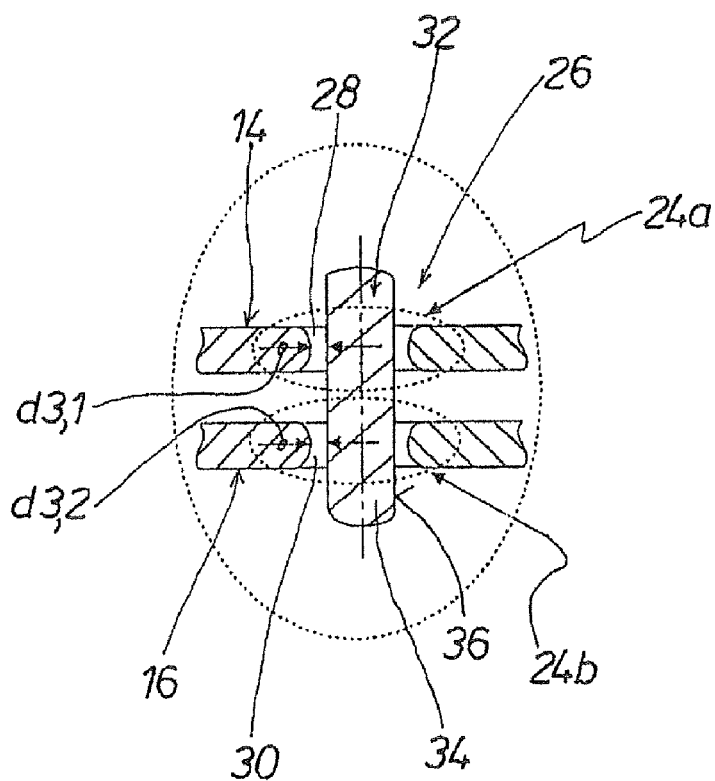
FIG. 5 is an enlarged, fragmentary, longitudinal-sectional view of a portion V in FIG. 4.

FIGS. 4 and 5 illustrate a series spark gap configuration of the resonator 12 of the microwave generator 10 shown in FIG. 2, with the distances d1, d2 and d4 being freely selectable, and with d1, d2, d4>d3,1 and d3,2. Furthermore, d3,1>d3,2 or d3,1<d3,2 or d3,1=d3,2 may be the case. In a special embodiment, d1=d2=d4>d3,1 and/or d3,2 may be the case. In this case, too, d3,1=d3,2 may be the case.

The basic principle of the series connection of at least two spark gaps 24a, 24b, . . . 24i is possible in different geometric variations. Some of these variations, without the invention being restricted to them, are illustrated in FIGS. 6A to 6D. These embodiments each show an integral or one-piece conductor element 34, which has a cylindrical outer surface 36 in FIG. 6A. The integral or one-piece conductor element 34 in FIG. 6B has a cylindrical outer surface 36 which is formed with circumferential beads 38. The beads 38 are disposed at an axial distance from one another which corresponds to the axial distance between the first and second electrodes 14 and 16.

FIG. 6C illustrates an embodiment in which the conductor element 34 has a graduated cylindrical surface 40. FIG. 6D shows an embodiment in which the conductor element 34 has a conical outer surface 42.

In the case of the embodiments of the spark gaps 24a, 24b, which are illustrated in FIGS. 6A to 6D by way of example but not in a restrictive manner, the principle character of the series connection and the relations specified in connection with FIGS. 4 and 5 with respect to the electrode gap distances d1, d2 and d4 or the spark gap distances d3,1, d3,2 apply.

Figure 7:
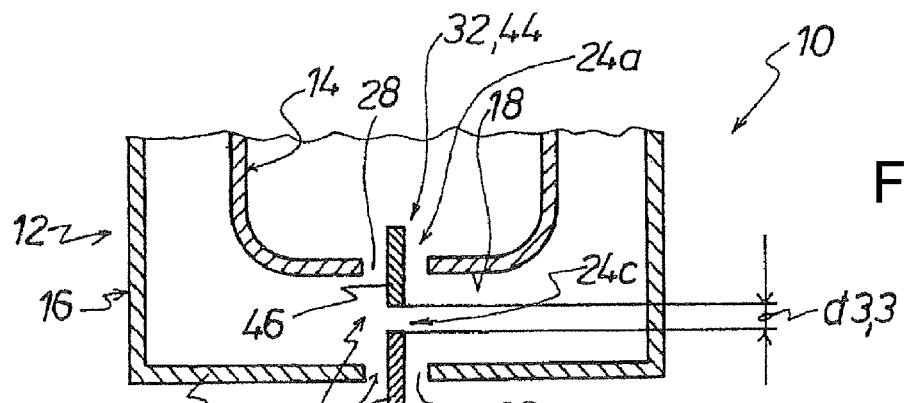
FIG. 7 is a fragmentary, longitudinal-sectional view, which is similar in principle to that in FIG. 2, of yet another embodiment of the microwave generator according to the invention or its spark gap device, with three spark gaps connected in series.
Figure 8:
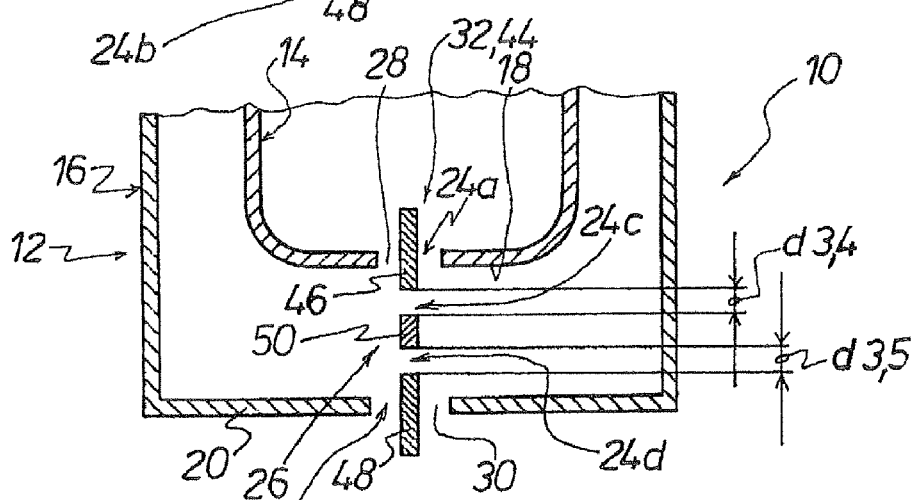
FIG. 8 is a fragmentary, longitudinal-sectional view of an embodiment of a microwave generator similar in principle to that in FIG. 7, with four spark gaps connected in series, which are determined by three conductor parts that are axially spaced apart from one another.
Figure 9:
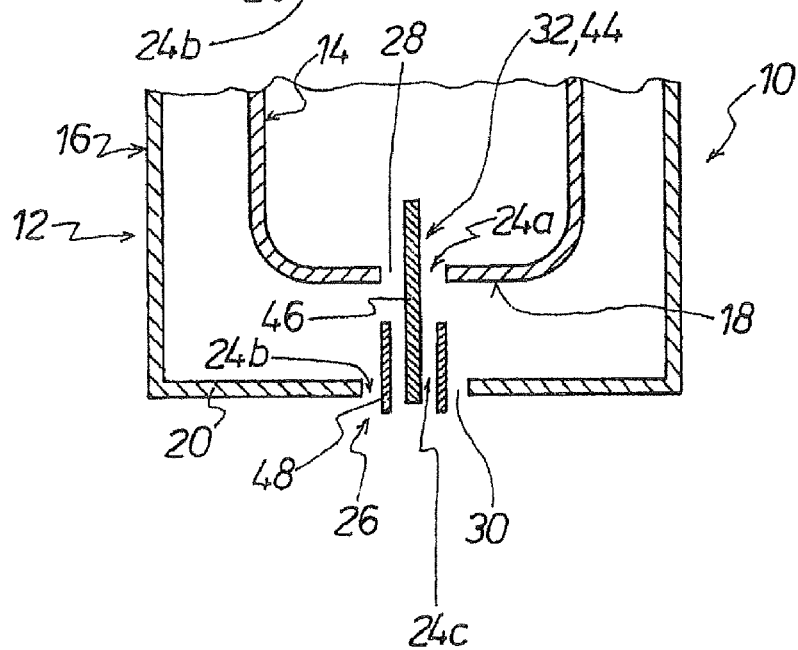
FIG. 9 is a fragmentary, longitudinal-sectional view similar to that in FIG. 7 or 8, of an embodiment of the microwave generator, in which the spark gap device is determined by conductor parts which are spaced radially apart from one another.

The rotationally symmetrical geometry of the spark gaps 24a, 24b, . . . 24i shown in FIGS. 6A to 6D and in FIGS. 7, 8 and 9, due to the provision of relatively large discharge surfaces, advantageously allows for a substantial increase in the endurance and therefore the life of the spark gap electrodes.

FIG. 7 diagrammatically illustrates an embodiment of the microwave generator 10 or its resonator 12, in which the conductor device 32, which extends through the first hole 28 and the second hole 30 of the electrodes 14 and 16, is formed by a two-part conductor structure 44. The conductor structure 44 includes two conductor parts 46 and 48, which are aligned axially with one another. A first conductor part 46 is associated with the first hole 28, and a second conductor part 48 is associated with the second hole 30. The two conductor parts 46 and 48 are disposed at a distance d3,3 from one another which is used to define a further, i.e. third, spark gap 24c.

FIG. 8 illustrates, in a similar illustration to that in FIG. 7, an embodiment in which the conductor structure 44 has three conductor parts 46, 48 and 50, that are aligned axially with one another and are spaced apart from one another in a defined manner. The conductor part 46 is associated with the first hole 28, and the conductor part 48 is associated with the second hole 30. The conductor part 50 is located between the conductor parts 46 and 48 and is spaced apart from them by distances d3,4 and d3,5, where that which has been said above in relation to the distances d3,3 and d3,1 and d3,2 applies correspondingly to the distances d3,4 and d3,5. The distances d3,4 and d3,5 define further spark gaps 24c and 24d.

While FIGS. 7 and 8 illustrate embodiments in which the conductor parts 46, 48, 50 are aligned axially with one another, FIG. 9 illustrates an embodiment in which the conductor parts 46 and 48 are spaced radially apart from one another in order to implement a corresponding number of spark gaps 24a, 24b and 24c.

The invention claimed is:

1. A microwave generator, comprising:
  a resonator having two mutually opposite and mutually coaxial resonator electrodes including a lobe-shaped inner electrode and a pot-shaped outer electrode engaging over said inner electrode;
  said inner electrode having an end face with a first hole formed therein, said outer electrode having a base with a second hole formed therein, said end face of said inner electrode facing said base of said outer electrode, and said first and second holes being mutually aligned axially;
  said resonator electrodes being constructed with a spark gap device breaking down upon application of an ignition voltage, said spark gap device having at least two spark gaps connected in series; and
  a conductor device extending through said first and second holes and spaced apart from said resonator electrodes.

2. The microwave generator according to claim 1, wherein said first and second holes have the same hole diameter.

3. The microwave generator according to claim 1, wherein said first and second holes have different hole diameters.

4. The microwave generator according to claim 1, wherein said conductor device extending through said first and second holes is formed by an integral conductor element.

5. The microwave generator according to claim 4, wherein said integral conductor element has a cylindrical outer surface.

6. The microwave generator according to claim 5, wherein said integral conductor element has a smooth outer surface.

7. The microwave generator according to claim 5, wherein said integral conductor element has a graduated smooth outer surface.

8. The microwave generator according to claim 5, wherein said integral conductor element is formed with axially spaced-apart beads.

9. The microwave generator according to claim 8, wherein said beads are positioned in said holes of said electrodes.

10. The microwave generator according to claim 4, wherein said integral conductor element has a conical outer surface.

11. The microwave generator according to claim 10, wherein said integral conductor element has a smooth outer surface.

12. The microwave generator according to claim 10, wherein said integral conductor element has a graduated smooth outer surface.

13. The microwave generator according to claim 10, wherein said integral conductor element is formed with axially spaced-apart beads.

14. The microwave generator according to claim 13, wherein said beads are positioned in said holes of said electrodes.

15. The microwave generator according to claim 1, wherein said conductor device extending through said first and second holes is formed by a multi-part conductor structure.

16. The microwave generator according to claim 15, wherein said multi-part conductor structure is formed of at least two conductor parts.

17. The microwave generator according to claim 16, wherein said at least two conductor parts are spaced axially apart from one another.

18. The microwave generator according to claim 16, wherein said at least two conductor parts are spaced radially apart from one another.

* * * * *